United States Patent
Ehlen

(10) Patent No.: US 10,349,551 B2
(45) Date of Patent: Jul. 9, 2019

(54) DEVICE DRAWER ASSEMBLY WITH CABLE PASS-THRU MODULE

(71) Applicant: Facebook, Inc., Menlo Park, CA (US)

(72) Inventor: Jon Brian Ehlen, Newark, CA (US)

(73) Assignee: Facebook, Inc., Menlo Park, CA (US)

( * ) Notice: Subject to any disclaimer, the term of this patent is extended or adjusted under 35 U.S.C. 154(b) by 0 days.

(21) Appl. No.: 15/788,764

(22) Filed: Oct. 19, 2017

(65) Prior Publication Data

US 2019/0124785 A1    Apr. 25, 2019

(51) Int. Cl.
| H05K 5/02 | (2006.01) |
| H05K 7/02 | (2006.01) |
| H05K 7/14 | (2006.01) |

(52) U.S. Cl.
CPC ......... H05K 7/1491 (2013.01); H05K 7/1492 (2013.01)

(58) Field of Classification Search
CPC ........................... H05K 7/1491; H05K 7/1492
USPC ....................................................... 361/724
See application file for complete search history.

(56) References Cited

U.S. PATENT DOCUMENTS

| 9,338,922 | B2* | 5/2016 | Mick .................... H05K 7/1491 |
| 9,578,779 | B2* | 2/2017 | Yi .......................... A47B 21/06 |
| 9,640,961 | B2* | 5/2017 | Chen ........................ H02G 3/32 |
| 2010/0110628 | A1* | 5/2010 | Barrenechea ........... G06F 1/183 |
| | | | 361/679.48 |
| 2014/0204537 | A1* | 7/2014 | Rust ..................... G11B 33/128 |
| | | | 361/727 |
| 2016/0037667 | A1* | 2/2016 | Wu ....................... H05K 7/1491 |
| | | | 312/223.6 |
| 2017/0116093 | A1* | 4/2017 | Arroyo ............... G06F 11/2017 |
| 2017/0181314 | A1* | 6/2017 | Leigh ................... H05K 7/1492 |

* cited by examiner

*Primary Examiner* — Rockshana D Chowdhury
(74) *Attorney, Agent, or Firm* — FisherBroyles, LLP

(57) ABSTRACT

Technology is provided for a device drawer assembly having a cable pass-thru module. The drawer assembly includes a chassis having a front opening and a rear wall opposite the front opening. A drawer is disposed in and moveable relative to the chassis. A cable support arm is coupled to the rear wall at a first end and coupled to the drawer at a second end. A pass-thru module is attached to the chassis adjacent the front opening and positioned between the drawer and the chassis. The pass-thru module includes drawer connectors and system connectors and one or more cables are each connected to a corresponding one of the drawer connectors. The cables are positioned between the drawer and the chassis and extend along the cable arm to terminate proximate a rear portion of the drawer for connection to one or more devices contained in the drawer.

6 Claims, 8 Drawing Sheets

DEVICE DRAWER ASSEMBLY WITH CABLE PASS-THRU MODULE

TECHNICAL FIELD

This patent application generally relates to data storage server configurations, and more specifically, to server drawer cable management.

BACKGROUND

Many servers and other computer systems contain components housed in a component rack in sliding drawers, which allows a user to easily access and service the components. Conventionally, cables are connected to components at the front of the sliding drawer to provide power and/or communication. The flexibility of the cables allows the cable to remain connected when the drawer is slid out of the rack. However, the cables must be long enough to allow for the desired travel length of the tray. Thus, if access to the entire length of the sliding drawer is desired, the cables must be at least as long as the length of the drawer. Therefore, when the drawers are closed there can be excess cable length (i.e., service loop) that needs to be stowed out of the way of the components and other drawers, for example. In conventional component rack configurations, the excess cable length is typically managed by strapping the cables to the rack's vertical cable trays with cooperative hook and loop straps.

BRIEF DESCRIPTION OF THE DRAWINGS

Embodiments of the device drawer assemblies with cable pass-thru modules disclosed herein may be better understood by referring to the following Detailed Description in conjunction with the accompanying drawings, in which like reference numerals indicate identical or functionally similar elements.

Figure 1A:
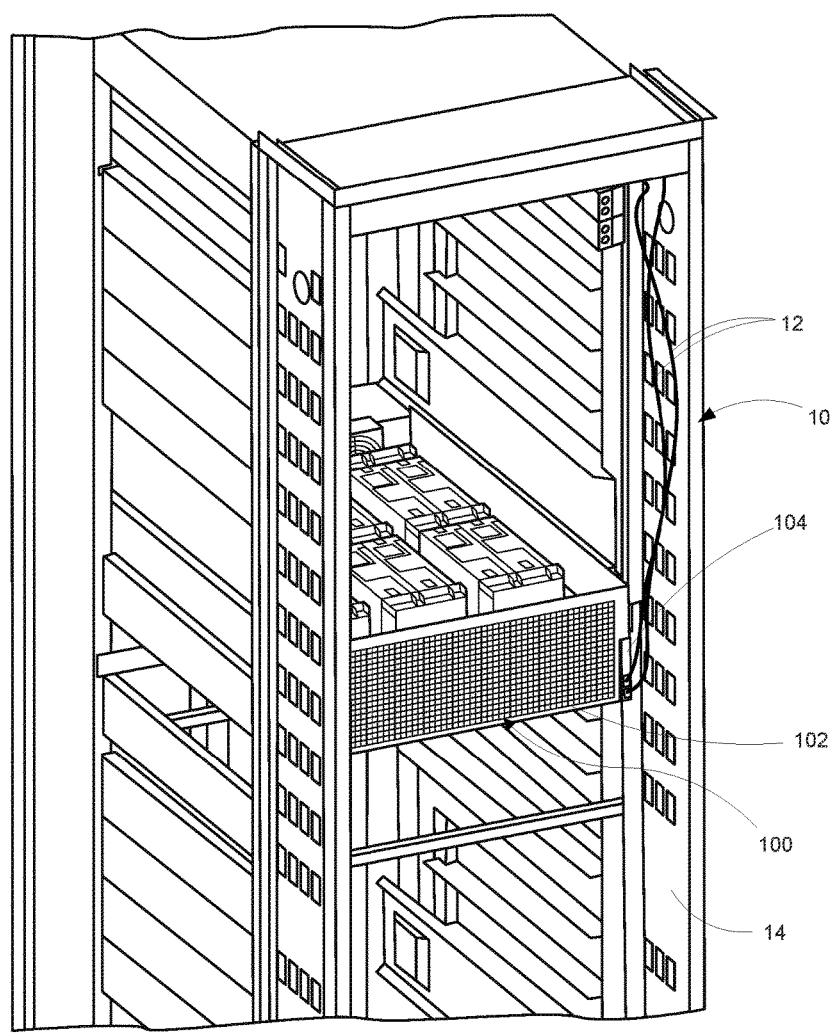
FIG. 1A is an isometric view of a device drawer assembly according to a representative embodiment mounted in a component rack.

The headings provided herein are for convenience only and do not necessarily affect the scope or meaning of the claimed embodiments. Further, the drawings have not necessarily been drawn to scale. For example, the dimensions of some of the elements in the figures may be expanded or reduced to help improve the understanding of the embodiments. Moreover, while the disclosed technology is amenable to various modifications and alternative forms, specific embodiments have been shown by way of example in the drawings and are described in detail below. The intention, however, is not to unnecessarily limit the embodiments described. On the contrary, the embodiments are intended to cover all suitable modifications, equivalents, and alternatives falling within the scope of the embodiments as defined by the appended claims.

DETAILED DESCRIPTION

Overview

A device drawer assembly having a cable pass-thru module is disclosed. In a representative embodiment, the drawer assembly can include a chassis mountable to a component rack and having a front opening and a rear wall opposite the front opening. A drawer is disposed in and moveable relative to the chassis. In some embodiments, a cable support arm can be coupled to the rear wall at a first end and coupled to the drawer at a second end. A pass-thru module is attached to the chassis adjacent the front opening and can be positioned between the drawer and the chassis. In some embodiments, the pass-thru module can include drawer connectors and system connectors and one or more drawer cables each connected to a corresponding one of the drawer connectors. The drawer cables are positioned between the drawer and the chassis and extend along the cable arm to terminate proximate a rear portion of the drawer for connection to one or more devices contained in the drawer. Therefore, when the drawers are closed the excess cable length (i.e., service loop) that allows the drawer to move in and out of the chassis is conveniently stowed out of the way within the device drawer assembly. Accordingly, system cables connected to the pass-thru module's system connectors do not need any excess cable length and can be neatly routed along the rack's cable trays.

General Description

Various examples of the devices introduced above will now be described in further detail. The following description provides specific details for a thorough understanding and enabling description of these examples. One skilled in the relevant art will understand, however, that the techniques discussed herein may be practiced without many of these details. Likewise, one skilled in the relevant art will also understand that the technology can include many other features not described in detail herein. Additionally, some well-known structures or functions may not be shown or described in detail below so as to avoid unnecessarily obscuring the relevant description.

The terminology used below is to be interpreted in its broadest reasonable manner, even though it is being used in conjunction with a detailed description of some specific examples of the embodiments. Indeed, some terms may even be emphasized below; however, any terminology intended to be interpreted in any restricted manner will be overtly and specifically defined as such in this section.

FIG. 1A illustrates a device drawer assembly 100 according to a representative embodiment. The device drawer assembly 100 can be mounted in a conventional component rack 10. The device drawer assembly 100 includes a drawer 102 movable relative to the component rack 10 between stowed and extended position, and a pass-thru module 104 that remains stationary relative to the component rack 10 when the drawer 102 moves between the stowed and extended positions. The pass-thru module 104 allows the drawer 102 to be connected to one or more system cables 12 (e.g., communication cables) without the need for excess cable length in the system cables 12, which is required in conventional systems to allow the drawer to move in and out of the rack. Accordingly, the system cables 12 can be neatly routed along the rack's cable tray 14.

Figure 1B:
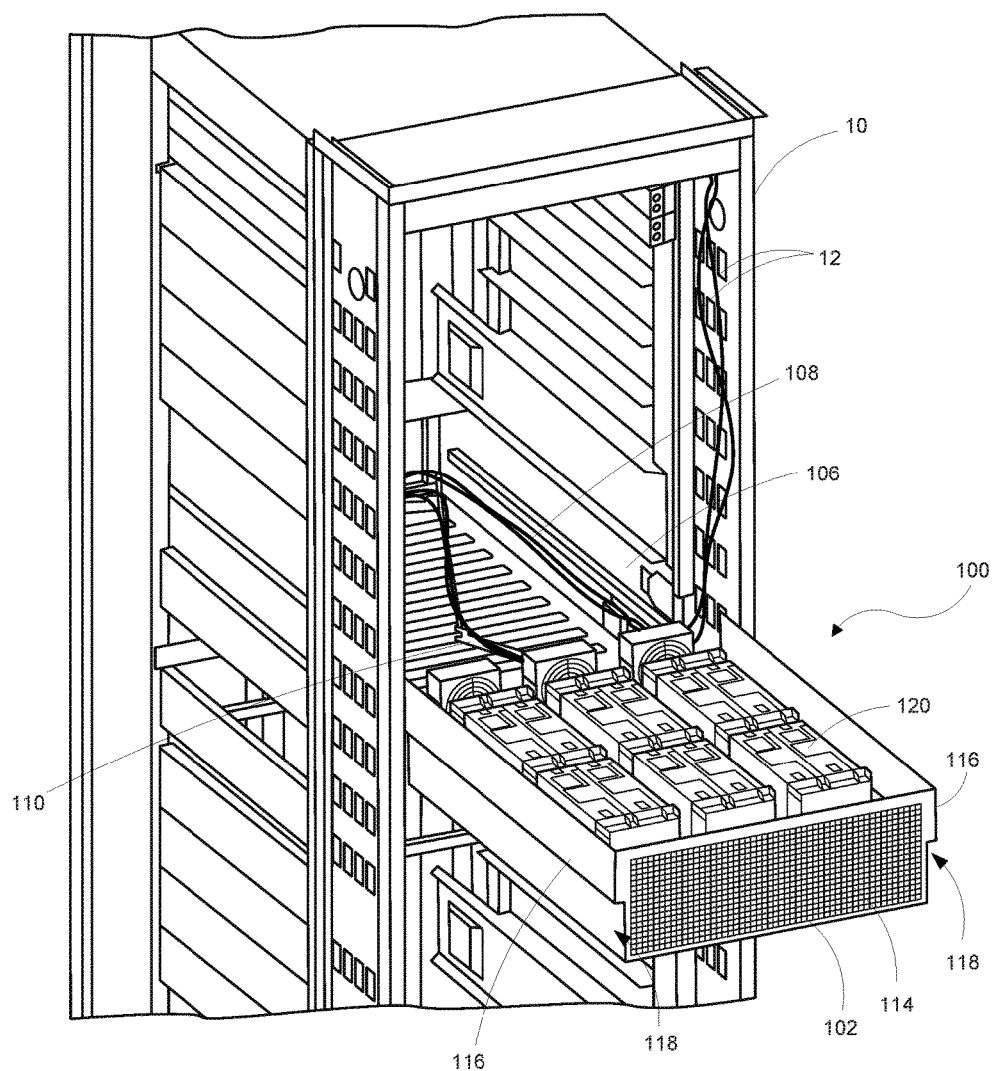
FIG. 1B is an isometric view of the device drawer assembly introduced in FIG. 1A with the drawer extended from the component rack.

With further reference to FIG. 1B, the device drawer assembly 100 includes a chassis 106 mountable to the component rack 10. The drawer 102 is disposed in and moveable relative to the chassis 106. One or more drawer cables 108 are connected to the pass-thru module 104 (FIG. 1A) and are routed between the drawer 102 and the chassis 106. The drawer cables 108 also extend along a cable support arm 110 to terminate proximate a rear portion of the drawer 102 for connection to one or more devices 120 contained in the drawer 102. The cable support arm 110, along with the drawer cables 108, folds and unfolds as the drawer 102 is moved into and out of the rack 10. Thus, the necessary cable length needed to move the drawer 102 into and out of the rack is conveniently stowed between the drawer 102 and the chassis 106.

Figure 2:
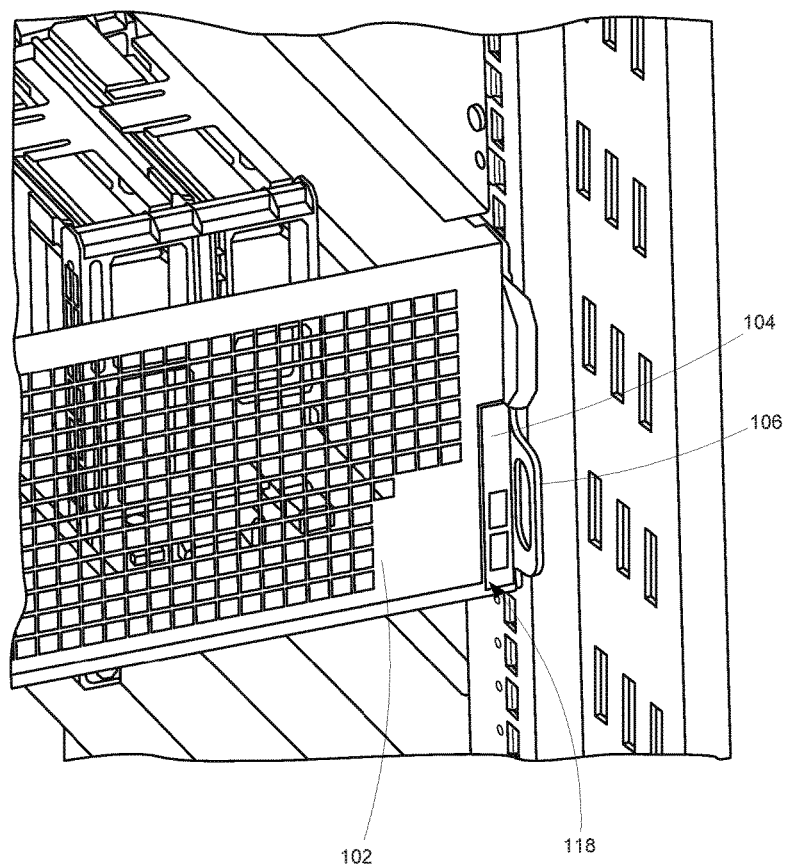
FIG. 2 is an enlarged partial isometric view of the pass-thru module shown in FIG. 1A positioned between the drawer chassis and device drawer.

The drawer 102 includes a front wall 114 and sidewalls 116. Referring to both FIGS. 1B and 2, the sidewalls 116 (FIG. 1B) are stepped to provide clearance 118 for the pass-thru module 104 and the drawer cables 108 (FIG. 1B). In some embodiments, the device drawer assembly 100 can include two pass-thru modules 104, one on either side of the drawer 102, along with corresponding cables. In some embodiments, the drawer 102 can have an open top and rear to facilitate servicing the devices 120 (FIG. 1B).

Figure 3:
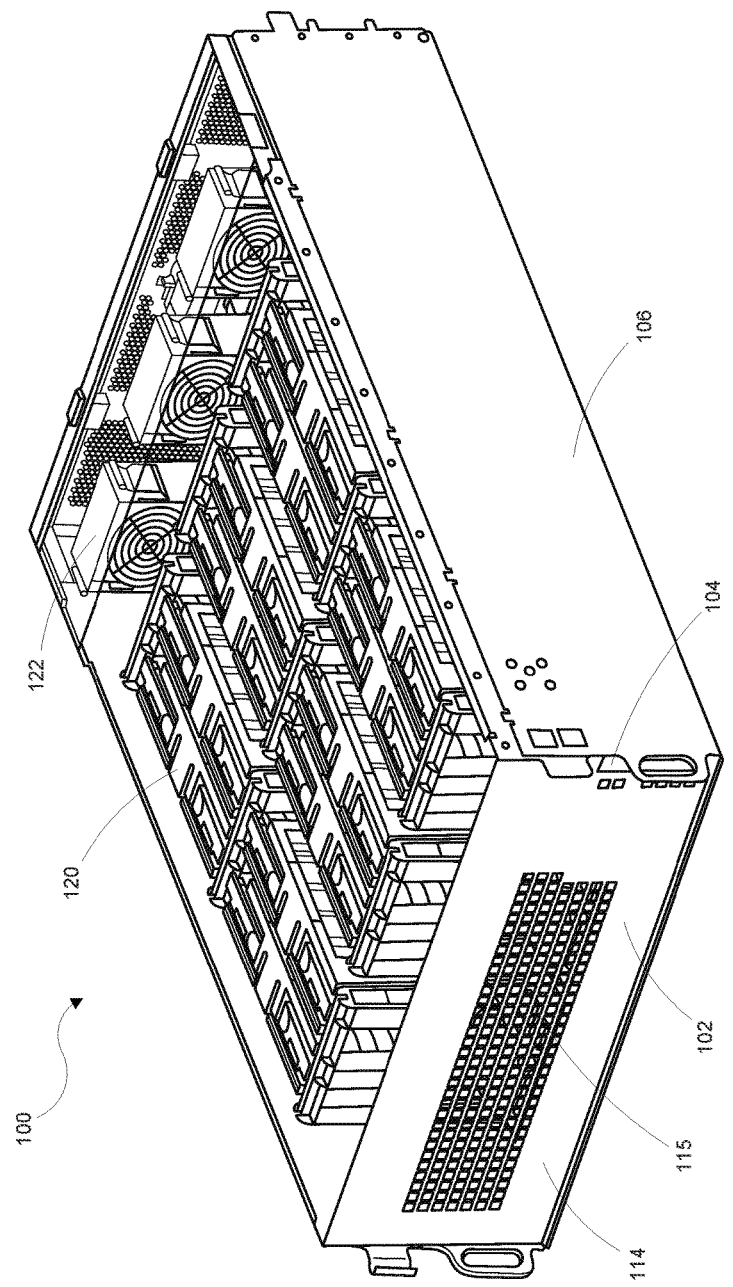
FIG. 3 is an isometric view of the device drawer assembly shown in FIGS. 1A and 1B.
Figure 4:
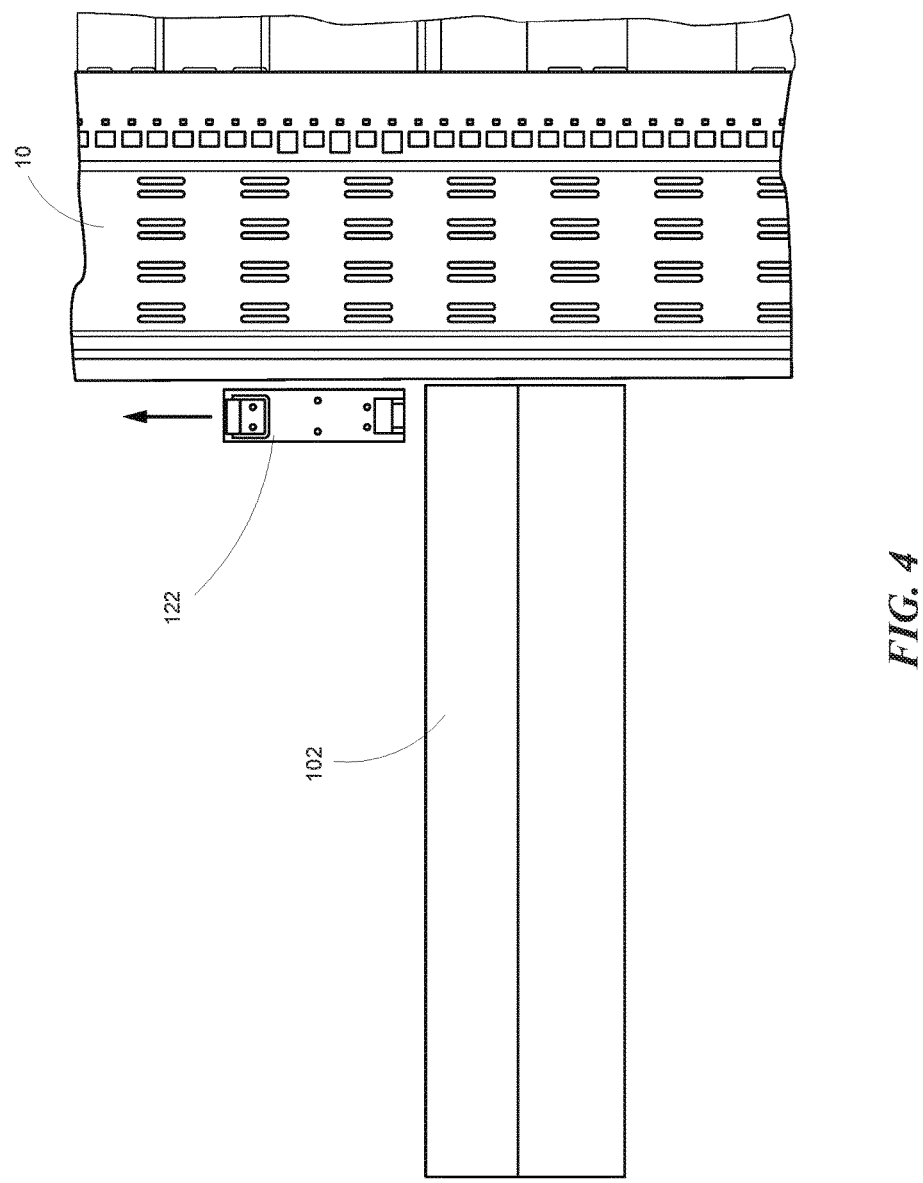
FIG. 4 is a side view in elevation of the device drawer fully extended from the component rack to facilitate fan removal.

As shown in FIG. 3, the drawer 102 can contain various devices 120, such as memory drives and/or server modules, for example. In some embodiments, the drawer 102 also contains one or more fans 122 for cooling the drawer devices 120. The fans 122 can move with the drawer 102 such that they are accessible for replacement or service when the drawer 102 is extended from the rack 10 (FIG. 4). The front wall 114 of the drawer 102 can include a plurality of air-flow openings 115 to allow the fans 122 to pull or push air through the drawer 102.

Figure 5:
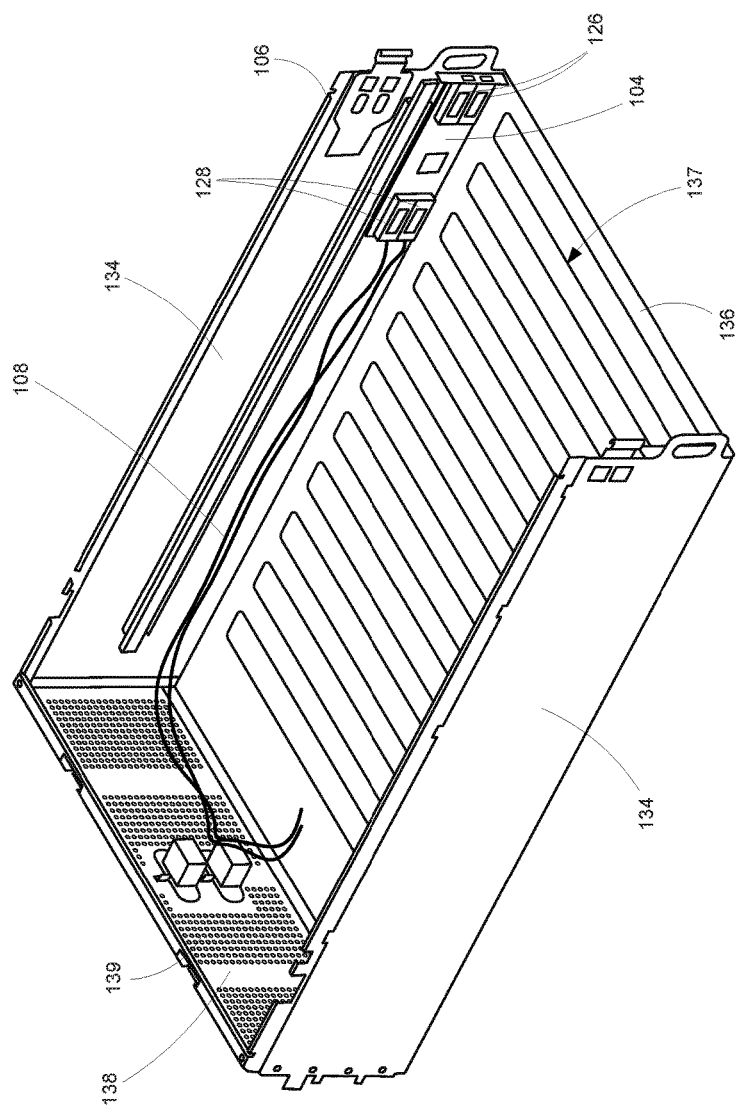
FIG. 5 is an isometric view of the drawer chassis shown in FIGS. 1A-4.

With reference to FIG. 5, the chassis 106 can have a front opening 137 and a rear wall 138 opposite the front opening 137. The rear wall 138 can include a plurality of air-flow openings 139 to allow the fans 122 (FIG. 3) to pull or push air through the drawer 102 (FIG. 3). The chassis 106 also includes a bottom panel 136 and a pair of sidewalls 134. In some embodiments, the chassis 106 includes a top cover (not shown) to enclose the chassis. The pass-thru module 104 is attached to the chassis sidewall 134 adjacent the front opening 137 and is positioned between the drawer sidewall 116 (FIG. 1B) and the chassis sidewall 134. The pass-thru module 104 includes one or more system connectors 126 and one or more drawer connectors 128. The system connectors 126 are each positioned proximate the front opening 137 and configured to receive a corresponding system cable 12 (FIG. 1B). The drawer cables 108 are connected to the drawer connectors 128. In some embodiments, the system connectors 126 and the drawer connectors 128 can be Quad Small Form-factor Pluggable (QSFP) connectors, for example.

Figure 6:
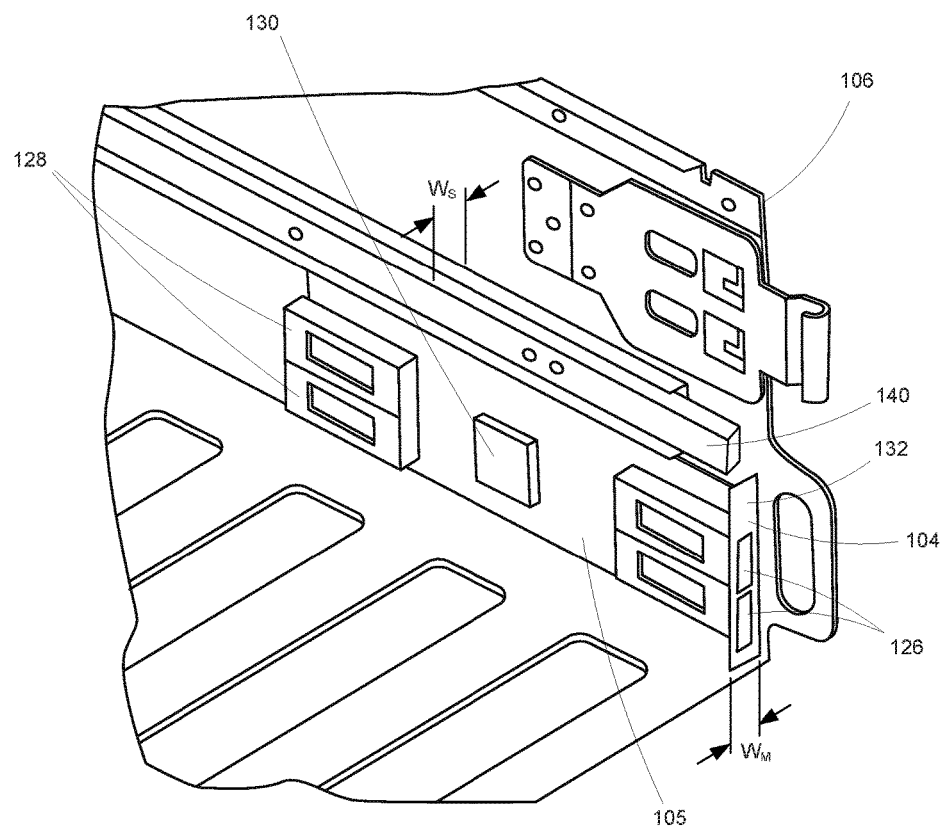
FIG. 6 is an enlarged isometric view of the pass-thru module mounted to the drawer chassis.

As shown in FIG. 6, the pass-thru module 104 can include a printed circuit board 105 mountable to the chassis 106. The system connectors 126 can be mounted to a first end portion of the printed circuit board 105 and the drawer connectors 128 can be mounted to a second end portion of the printed circuit board 105. In some embodiments, a re-timer or re-driver circuit 130 is disposed on the printed circuit board 105 and is operative to receive a signal via the system connectors 126 and boost the signal for output via the drawer connectors 128. In some embodiments, the pass-thru module 104 includes a connector panel 132 supporting the system connectors 126. The device drawer assembly 100 includes a pair of drawer slides 140 coupling the drawer 102 to the chassis 106. The pass-thru module 104 is sized and configured to be positioned between the drawer and the drawer mounting chassis. Accordingly, in some embodiments, the pass-thru module 104 has a module width $W_M$ less than a width $W_S$ of the drawer slides 140.

Figure 7:
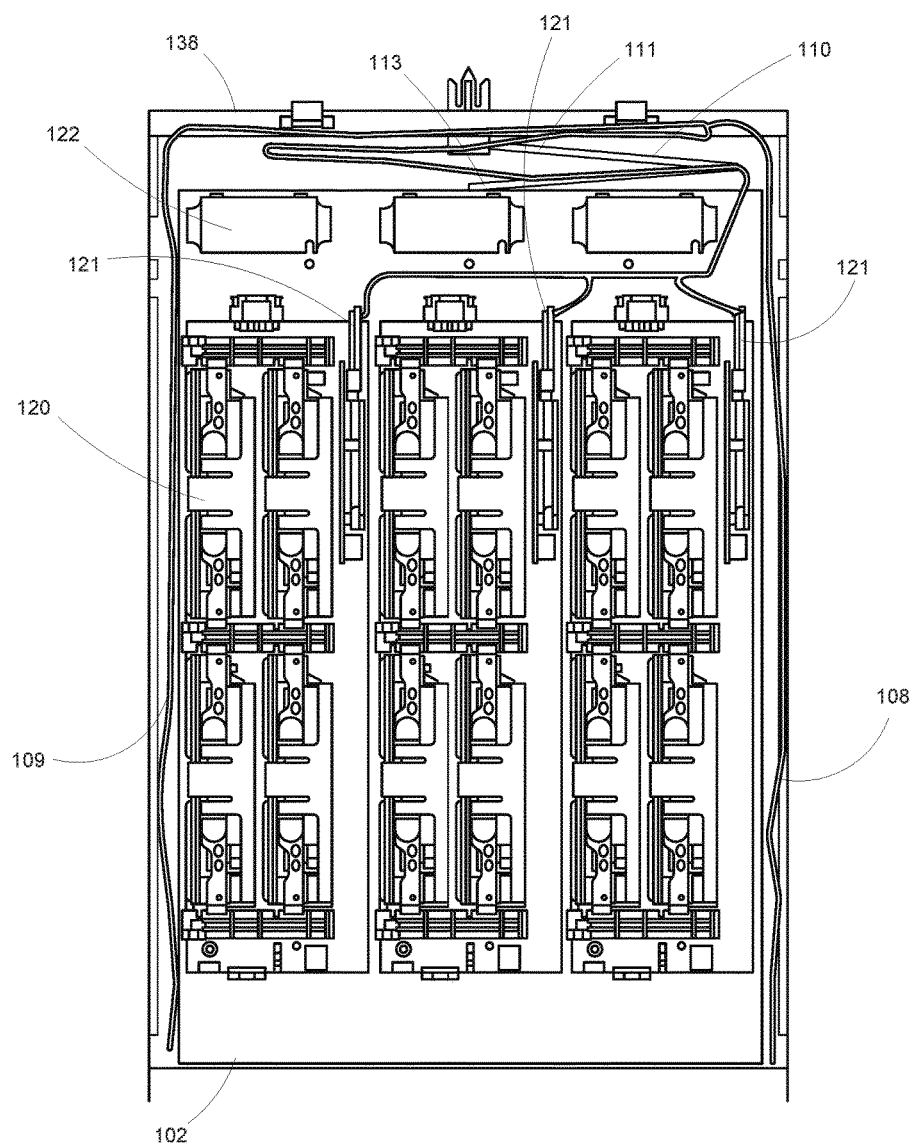
FIG. 7 is a top plan view of the device drawer assembly.

As shown in FIG. 7, the drawer cables 108 can connect to one or more peripheral component interconnect (PCI) cards 121 associated with the devices 120 contained in the drawer 102. The cable support arm 110 is coupled to the rear wall 138 at a first arm end portion 111 and coupled to the drawer 102 at a second arm end portion 113. As mentioned above, some embodiments can include two pass-thru modules 104 (FIG. 6), one on either side of the drawer 102, along with corresponding cables, such as drawer cables 109.

Remarks

The above description and drawings are illustrative and are not to be construed as limiting. Numerous specific details are described to provide a thorough understanding of the disclosure. However, in some instances, well-known details are not described in order to avoid obscuring the description. Further, various modifications may be made without deviating from the scope of the embodiments. Accordingly, the embodiments are not limited except as by the appended claims.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not for other embodiments.

The terms used in this specification generally have their ordinary meanings in the art, within the context of the disclosure, and in the specific context where each term is used. It will be appreciated that the same thing can be said in more than one way. Consequently, alternative language and synonyms may be used for any one or more of the terms discussed herein, and any special significance is not to be placed upon whether or not a term is elaborated or discussed herein. Synonyms for some terms are provided. A recital of one or more synonyms does not exclude the use of other synonyms. The use of examples anywhere in this specification, including examples of any term discussed herein, is illustrative only and is not intended to further limit the scope and meaning of the disclosure or of any exemplified term. Likewise, the disclosure is not limited to various embodiments given in this specification. Unless otherwise defined, all technical and scientific terms used herein have the same meaning as commonly understood by one of ordinary skill in the art to which this disclosure pertains. In the case of conflict, the present document, including definitions, will control.

What is claimed is:

1. A device drawer assembly, comprising:
   a chassis having a front opening and a rear wall opposite the front opening mountable to a component rack;
   a drawer disposed in and moveable relative to the chassis;

a cable support arm coupled to the rear wall at a first arm end portion and coupled to the drawer at a second arm end portion; and a pass-thru module attached to the chassis adjacent the front opening and positioned between the drawer and the chassis, the pass-thru module including:

one or more drawer connectors to connect to one or more drawer cables;

one or more system connectors to connect to one or more system cables, the one or more system connectors being positioned proximate the front opening of the chassis;

a re-timer circuit operative to boost signals traveling on at least one of the one or more drawer cables or at least one of the one or more system cables; and a printed circuit board upon which the re-timer circuit is disposed; and wherein the one or more drawer cables are positioned between the drawer and the chassis and extend along the cable support arm to terminate proximate a rear portion of the drawer for connection to one or more devices contained in the drawer.

2. The device drawer assembly of claim 1, further comprising the one or more devices contained in the drawer.

3. The device drawer assembly of claim 1, further comprising one or more drawer slides coupling the drawer to the chassis, wherein the one or more drawer slides have a slide width.

4. The device drawer assembly of claim 3, wherein the pass-thru module has a module width less than the slide width.

5. The device drawer assembly of claim 1, wherein the chassis and the drawer each include a sidewall, and wherein the pass-thru module is positioned between the sidewall of the drawer and the sidewall of the chassis.

6. The device drawer assembly of claim 5, wherein the pass-thru module further comprises a panel supporting the one or more system connectors.

* * * * *